US009307612B2

(12) United States Patent
Jao et al.

(10) Patent No.: US 9,307,612 B2
(45) Date of Patent: Apr. 5, 2016

(54) LIGHT EMITTING DEVICE DRIVER CIRCUIT AND DRIVING METHOD OF LIGHT EMITTING DEVICE CIRCUIT

(71) Applicants: Tong-Cheng Jao, Taichung (TW); Isaac Y. Chen, Zhubei (TW); Yi-Wei Lee, Taipei (TW)

(72) Inventors: Tong-Cheng Jao, Taichung (TW); Isaac Y. Chen, Zhubei (TW); Yi-Wei Lee, Taipei (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 14/728,554

(22) Filed: Jun. 2, 2015

(65) Prior Publication Data
US 2015/0366028 A1    Dec. 17, 2015

(30) Foreign Application Priority Data

Jun. 11, 2014    (TW) .............................. 103120122 A

(51) Int. Cl.
*H05B 37/00* (2006.01)
*H05B 37/02* (2006.01)
*H01L 25/00* (2006.01)

(52) U.S. Cl.
CPC ................ *H05B 37/00* (2013.01); *H01L 25/00* (2013.01)

(58) Field of Classification Search
CPC ........ H05B 37/00; H05B 37/02; H05B 33/08; H05B 33/0815; H05B 33/083; H05B 33/0845
USPC .......... 315/122, 123, 185 R, 186, 200 R, 291, 315/307, 308
See application file for complete search history.

(56) References Cited

U.S. PATENT DOCUMENTS

| 6,989,807 | B2 | 1/2006 | Chiang |
| 7,081,722 | B1 | 7/2006 | Huynh et al. |
| 9,084,323 | B2* | 7/2015 | Yang .................... H05B 33/083 |
| 2011/0273102 | A1 | 11/2011 | Van de Ven et al. |
| 2014/0184077 | A1* | 7/2014 | Lee ...................... H05B 33/083 315/122 |
| 2014/0333215 | A1* | 11/2014 | Chiu .................... H05B 33/083 315/185 R |

* cited by examiner

*Primary Examiner* — Thai Pham
(74) *Attorney, Agent, or Firm* — Tung & Associates

(57) ABSTRACT

The present invention discloses a light emitting device driver circuit and a driving method of a light emitting device circuit. The light emitting device driver circuit is for driving a light emitting device circuit with plural light emitting devices connected in series. The light emitting device driver circuit determines a number of the conductive light emitting devices according to a rectified input voltage. The light emitting device driver circuit includes: a switch module, a current source circuit, and a total harmonic distortion (THD) compensation circuit. The THD compensation circuit generates an adjustment current according to the rectified input voltage. The current source circuit provides a light emitting device current to the light emitting device circuit according to the adjustment current, such that the THD is reduced.

12 Claims, 12 Drawing Sheets

LIGHT EMITTING DEVICE DRIVER CIRCUIT AND DRIVING METHOD OF LIGHT EMITTING DEVICE CIRCUIT

CROSS REFERENCE

The present invention claims priority to TW 103120122, filed on Jun. 11, 2014.

BACKGROUND OF THE INVENTION

1. Field of Invention

The present invention relates to a light emitting device driver circuit and a driving method of a light emitting device circuit; particularly, it relates to such light emitting device driver circuit with total harmonic distortion (THD) compensation and a method for driving such a light emitting device circuit.

2. Description of Related Art

FIG. 1A shows a schematic diagram of a prior art light emitting diode (LED) driver circuit 10 and its related circuits. As shown in FIG. 1A, the LED driver circuit 10 includes a switch circuit 11, a switch control circuit 12, and a constant current source 13. The LED driver circuit 10 drives an LED circuit 20. The LED circuit 20 includes plural LEDs connected in series, and the plural LEDs are divided into plural LED groups, e.g. four LED groups G1, G2, G3, and G4 as shown in FIG. 1A. The switch circuit 11 includes plural switches (e.g. four switches S1, S2, S3, and S4 as shown in FIG. 1A), which are electrically connected to the corresponding LED groups G1, G2, G3, and G4 respectively. A rectifier circuit 30 rectifies an AC voltage provided by an AC power source 40, to generate a rectified input voltage Vin as shown in FIG. 1B. The LED driver circuit 10 drives the LED circuit 20 by turning ON or OFF the switches S1-S4 according to the level of the rectified input voltage Vin, whereby one or more of the LED groups G1-G4 glow accordingly.

For example, as shown by the signal waveforms in FIG. 1B, when the level of the rectified input voltage Vin is lower than level L1, the switch control circuit 12 turns OFF all the switches S1-S4. When the level of the rectified input voltage Vin is between levels L1 and L2, the switch control circuit 12 turns ON the switch S1, and turns OFF the switches S2-S4, whereby the LED group G1 glows. Similarly, when the level of the rectified input voltage Vin is between levels L2 and L3, the switch S2 is turned ON, and the switches S1 and S3-S4 are turned OFF, whereby the LED groups G1-G2 glow. Similarly, when the level of the rectified input voltage Vin is between levels L3 and L4, the switch S3 is turned ON, and the switches S1-S2 and S4 are turned OFF, whereby the LED groups G1-G3 glow. And when the level of the rectified input voltage Vin exceeds level L4, the switch S4 is turned ON, and the switches S1-S3 are turned OFF, whereby the LED groups G1-G4 glow. U.S. Pat. No. 6,989,807, U.S. Pat. No. 7,081,722 and US 2011/0273102 are relevant prior art patents for reference.

In the prior art illustrated by FIGS. 1A and 1B, the constant current source 13 provides a constant current, that is, when one or more of the LED groups G1-G4 glow, the current I1 flowing through the conductive LED(s) is constant. Referring to the signal waveform of the current I1 as shown in FIG. 1B, regardless how many LED groups of the LED groups G1-G4 glow, the current flowing through the conductive LED(s) is the constant current. Only when the level of the rectified input voltage Vin is lower than the level L1, i.e., when all the switches S1-S4 are turned OFF, the current I1 is zero current.

In comparison with a conventional driver circuit which drives the LED circuit by a DC voltage, the prior art LED driver circuit 10 has an advantage that the manufacturing cost of the LED driver circuit 10 is relatively lower because it does not need to convert the rectified input voltage to a DC voltage. If the rectified input voltage has a frequency which is enough high, naked eyes will not perceive any flicker of the LED circuit 20. However, the prior art LED driver circuit 10 has a disadvantage that a total harmonic distortion (THD) of the prior art LED driver circuit 10 is high.

In view of above, the present invention proposes a light emitting device driver circuit with THD compensation and a method for driving a light emitting device circuit.

SUMMARY OF THE INVENTION

From one perspective, the present invention provides a light emitting device driver circuit for driving a light emitting device circuit which is operative according to a rectified input voltage, the light emitting device circuit including a plurality of light emitting devices connected in series, the plural light emitting devices being divided into a plurality of groups, wherein each group includes at least one light emitting device, the light emitting device driver circuit including: a switch module, which includes a plurality of switches, wherein each switch is coupled to a corresponding one of the groups, for determining which of the light emitting devices are turned ON according to the rectified input voltage; a current source circuit, which is coupled to the switch module, for providing a light emitting device current according to an adjustment current when at least one of the light emitting devices is turned ON, wherein the light emitting device current is not a constant, and the light emitting device current has substantially the same phase angle as the rectified input voltage for at least a part of time in a cycle period of the rectified input voltage; and a THD compensation circuit, which is coupled to the current source circuit, for generating the adjustment current according to the rectified input voltage.

In one preferable embodiment, the adjustment current has a substantially same phase angle as the rectified input voltage.

In one preferable embodiment, the THD compensation circuit includes a voltage-to-current conversion circuit, for converting the rectified input voltage to a THD compensation current.

In one preferable embodiment, the THD compensation circuit further includes: a setting current generation circuit, for generating a setting current according to a reference signal; and an adder/subtractor circuit, which is coupled to the voltage-to-current conversion circuit and the setting current generation circuit, for generating the adjustment current according to the THD compensation current and the setting current.

In one preferable embodiment, the voltage-to-current conversion circuit includes: an input voltage sense circuit, for receiving the rectified input voltage and generating an input voltage sampling signal; and a current duplication circuit, which is coupled to the input voltage sense circuit, for generating the THD compensation current according to the input voltage sampling signal.

In one preferable embodiment, the voltage-to-current conversion circuit includes: an input voltage sense circuit, for receiving the rectified input voltage and generating an input voltage sampling signal; an amplifier circuit, which is coupled to the input voltage sense circuit, for generating a converted current according to the input voltage sampling signal and a reference signal; and a current mirror circuit, which is coupled to the amplifier circuit, for generating the THD compensation current according to the converted current.

In one preferable embodiment, the voltage-to-current conversion circuit includes: an input voltage sense circuit which includes a voltage divider circuit, for generating a divided voltage of the rectified input voltage as an input voltage sampling signal; an amplifier circuit, which is coupled to the input voltage sense circuit, for generating a converted current according to the input voltage sampling signal; and a current mirror circuit, which is coupled to the amplifier circuit, for generating the THD compensation current according to the converted current.

In one preferable embodiment, the setting current generation circuit includes: an amplifier circuit, for generating a reference current according to the reference signal; and a current mirror circuit, which is coupled to the amplifier circuit, for generating the setting current according to the reference current.

From another perspective, the present invention provides a method for driving a light emitting device circuit, wherein the light emitting device circuit includes a plurality of light emitting devices connected in series, the plural light emitting devices being divided into a plurality of groups, wherein each group includes at least one light emitting device, the method comprising: providing a rectified input voltage; determining which of the light emitting devices are turned ON according to the rectified input voltage; generating an adjustment current according to the rectified input voltage, wherein the adjustment current has a substantially same phase angle as the rectified input voltage; and providing a light emitting device current to the turned-ON light emitting device(s) according to an adjustment current, wherein the light emitting device current is not a constant, and the light emitting device current has substantially the same phase angle as the rectified input voltage for at least apart of time in a cycle period of the rectified input voltage.

In one preferable embodiment, the step of generating the adjustment current according to the rectified input voltage includes: providing an input voltage sampling signal according to the rectified input voltage; generating a converted current according to the input voltage sampling signal; and converting the converted current to the adjustment current.

In one preferable embodiment, the step of generating the adjustment current according to the rectified input voltage includes: converting the rectified input voltage to a total harmonic distortion (THD) compensation current; generating a setting current according to a reference signal; and generating the adjustment current according to the THD compensation current and the setting current.

In one preferable embodiment, the step of generating the adjustment current according to the THD compensation current and the setting current includes: adding the THD compensation current with the setting current to generate a sum as the adjustment current, or subtracting one of the THD compensation current and the setting current from the other to generate a difference as the adjustment current.

In one preferable embodiment, the THD compensation current has a waveform which has a substantially same phase angle as the rectified input voltage, and an amplitude direction which is the same as the rectified input voltage.

In one preferable embodiment, the THD compensation current has a waveform which has a substantially same phase angle as the rectified input voltage, and an amplitude direction opposite to the rectified input voltage.

The objectives, technical details, features, and effects of the present invention will be better understood with regard to the detailed description of the embodiments below.

DESCRIPTION OF THE PREFERRED EMBODIMENTS

Figure 1A:
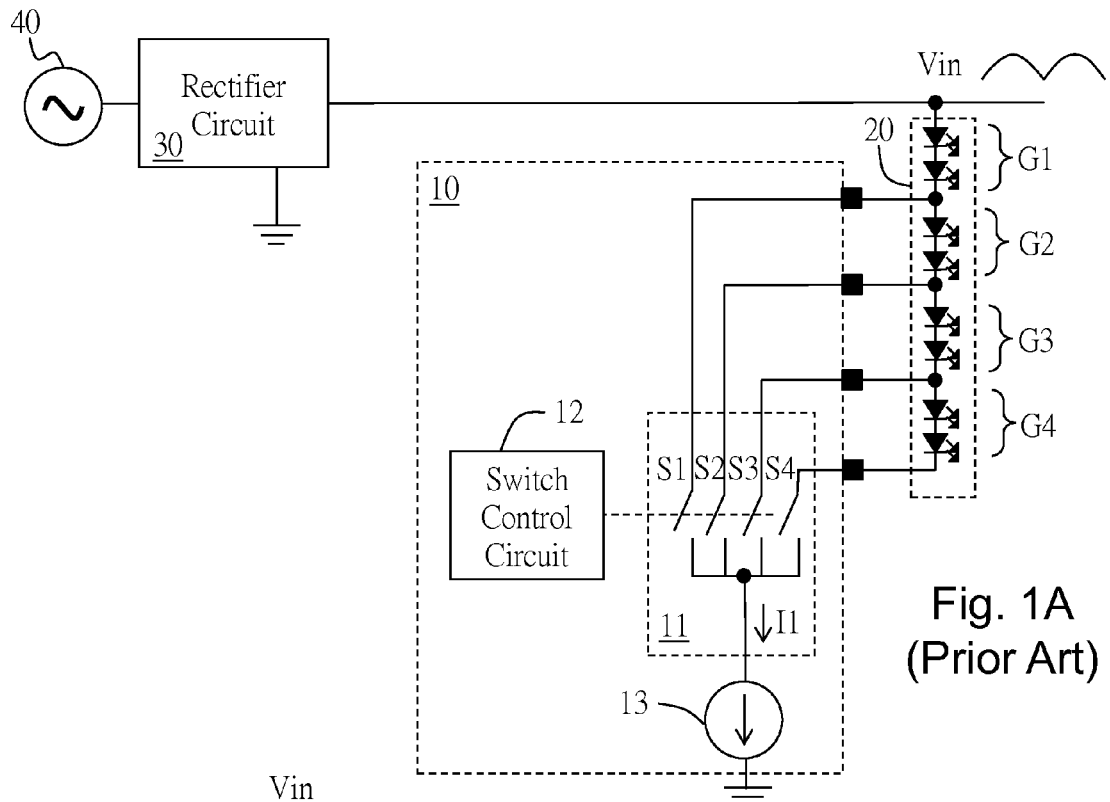
FIG. 1A shows a schematic diagram of a prior art LED driver circuit 10 and its related circuits.
Figure 1B:
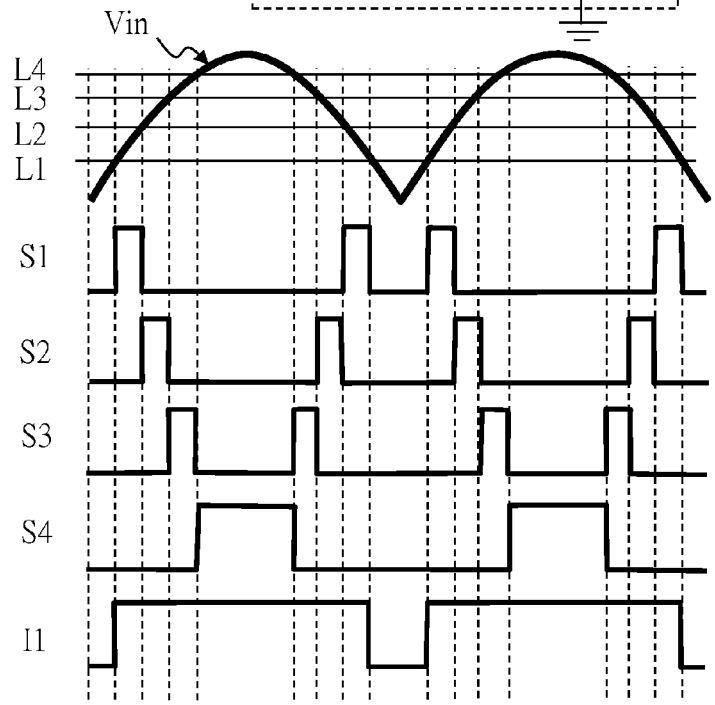
FIG. 1B shows the signal waveforms of the prior art LED driver circuit 10 and its related circuits.
Figure 2A:
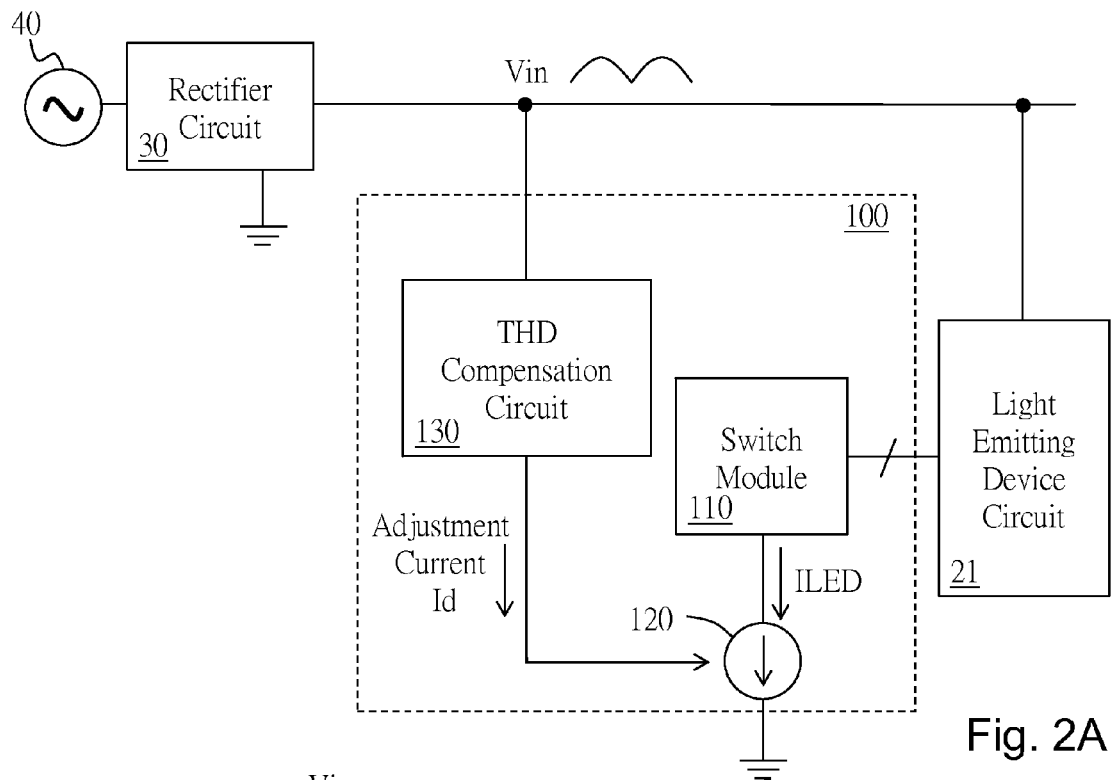
FIGS. 2A and 2B show a first embodiment of the present invention.
Figure 2B:
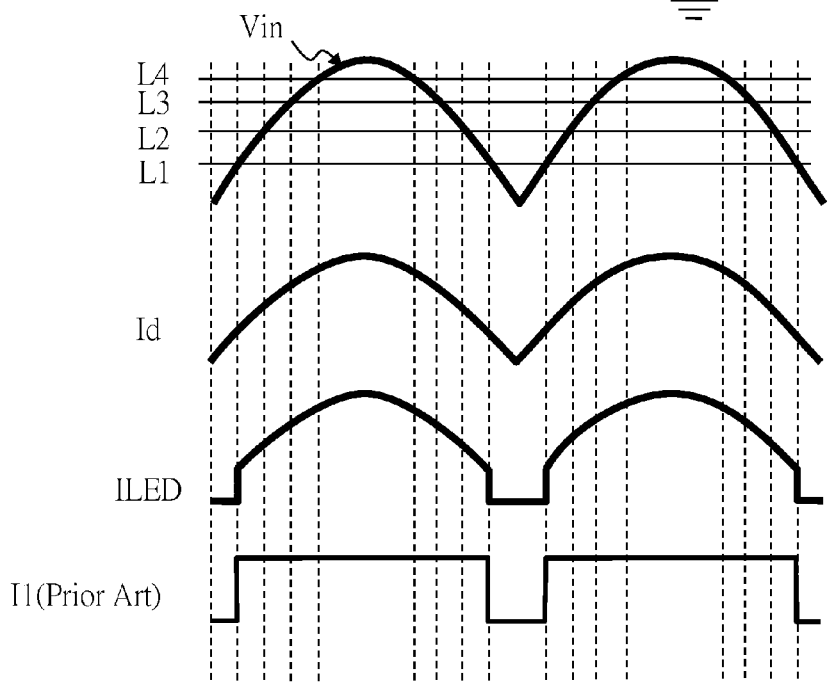

Please refer to FIGS. 2A and 2B for a first embodiment according to the present invention. As shown in FIG. 2A, a light emitting device driver circuit 100 drives a light emitting device circuit 21; the light emitting device circuit 21 for example includes plural LEDs connected in series, and the plural LEDs are divided into plural LED groups, for example arranged as the prior art shown in FIG. 1A, including four LED groups G1, G2, G3, and G4. However, that the light emitting device circuit 21 includes one single LED string divided into four LED groups is only one non-limiting example; in another embodiment, the light emitting device circuit 21 may include an LED array consisting of plural LED strings connected in parallel, or a light emitting device array in other forms. The rectified circuit 30 generates the rectified input voltage Vin. The light emitting device circuit 21 receives the rectified input voltage Vin, and the light emitting device driver circuit 100 determines which of the light emitting devices in the light emitting device circuit 21 should be turned ON according to the rectified input voltage Vin.

Still referring to FIG. 2A, the light emitting device driver circuit 100 includes a switch module 110, a current source circuit 120, and a total harmonic distortion (THD) compensation circuit 130. The switch module 110 includes for example but not limited to the switch circuit 11 and the switch control circuit 12 as shown in FIG. 1A. The switch circuit 11 includes plural switches (e.g. four switches S1, S2, S3, and S4 as shown in FIG. 1A), which are electrically connected to the corresponding LED groups G1, G2, G3, and G4 respectively. The LED driver circuit 10 drives the LED circuit 20 by turning ON or OFF the switches S1-S4 respectively according to the level of the rectified input voltage Vin, whereby one or more of the LED groups G1-G4 glow accordingly. For example, similar to the prior art LED driver circuit 10, when the level of the rectified input voltage Vin is lower than level L1, the switch control circuit 12 turns OFF all the switches S1-S4. When the level of the rectified input voltage Vin is between levels L1 and L2, the switch control circuit 12 turns ON the switch S1, and turns OFF the switches S2-S4, whereby the LED group G1 glows. When the level of the rectified input voltage Vin is between levels L2 and L3, the switch S2 is turned ON, and the switches S1 and S3-S4 are turned OFF, whereby the LED groups G1-G2 glow. When the level of the rectified input voltage Vin is between levels L3 and L4, the switch S3 is turned ON, and the switches S1-S2 and S4 are turned OFF, whereby the LED groups G1-G3 glow. And when the level of the rectified input voltage Vin exceeds level L4, the switch S4 is turned ON, and the switches S1-S3 are turned OFF, whereby the LED groups G1-G4 glow.

The present invention is different from the prior art LED driver circuit 10 in that, in this embodiment, the current source circuit 120 is coupled to the THD compensation circuit 130, for providing a light emitting device current ILED to the conductive light emitting device(s) according to an adjustment current Id to reduce the THD of the light emitting device driver circuit 100. The signal waveform of the adjustment current Id is shown in FIG. 2B.

In one preferable embodiment, the adjustment current Id and the rectified input voltage Vin are substantially in-phase, i.e., they have substantially the same phase angle. Hence, when the rectified input voltage Vin exceeds a predetermined level (L1 in this embodiment) whereby at least one light emitting device is turned ON, the light emitting device current ILED and the rectified input voltage Vin are also substantially in-phase (have substantially the same phase angle) to reduce the THD. According to the present invention, the light emitting device current ILED is not a constant, and most of the time the light emitting device current ILED follows a semi-sinusoid waveform; thus, in every cycle period of the rectified input voltage, the light emitting device current ILED has substantially the same phase angle as the rectified input voltage Vin for at least a significant part of the time. Note that "substantially the same phase angle" does not require the phase angle of the light emitting device current ILED and the phase angle of the rectified input voltage Vin to be exactly the same without any deviation; instead, minor deviations are tolerable, as long as the adjustment current Id (and therefore the light emitting device current ILED, for at least a significant part of the time) has relatively similar phase angle to the phase angle of the rectified input voltage Vin in comparison with the prior art current I1 shown in FIG. 2B, such that the THD of the light emitting device driver circuit 100 is reduced. Besides, the aforementioned "predetermined level" indicates the level L1 according to the first embodiment of the present invention, i.e., the level of the rectified input voltage Vin when the light emitting device current ILED starts to be a non-zero current as shown in FIG. 2B.

Figure 3:
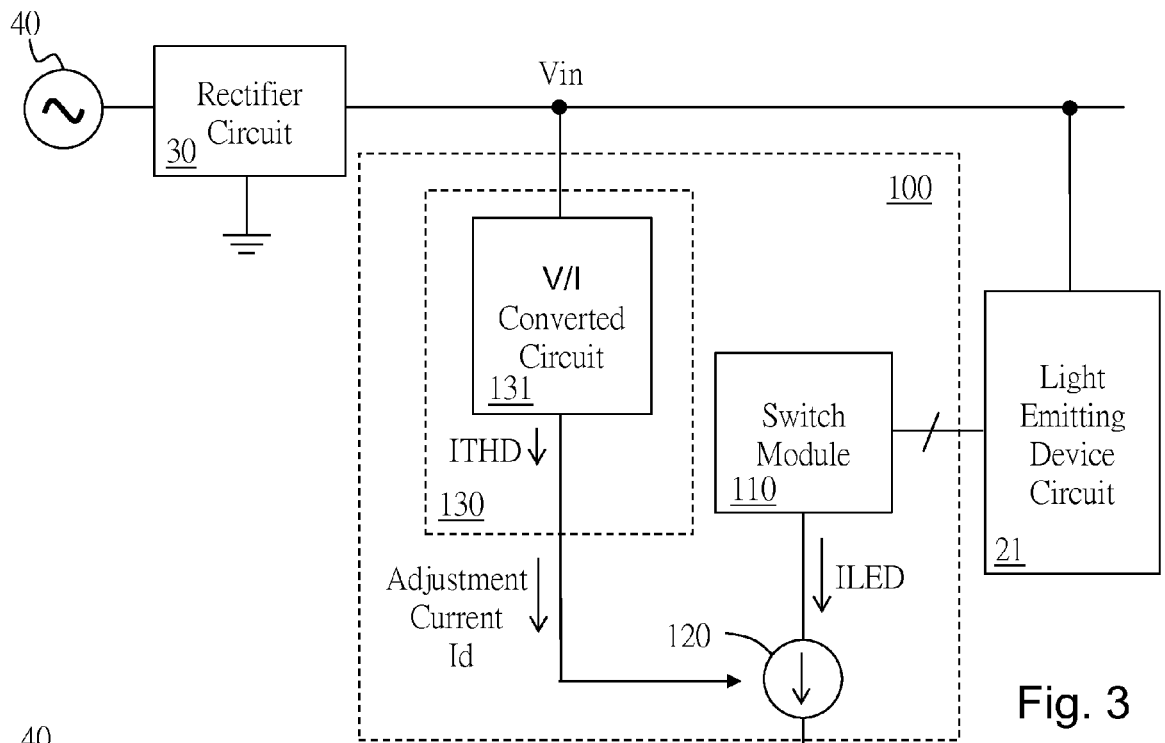
FIG. 3 shows a second embodiment of the present invention.

FIG. 3 shows a second embodiment of the present invention. This embodiment shows a first embodiment of the THD compensation circuit 130. In this embodiment, the THD compensation circuit 130 includes a voltage-to-current (V/I) conversion circuit 130, which receives the rectified input voltage Vin and converts the rectified input voltage Vin to a THD compensation current ITHD. In this embodiment, the THD compensation current ITHD is directly used as the adjustment current Id.

Figure 4:
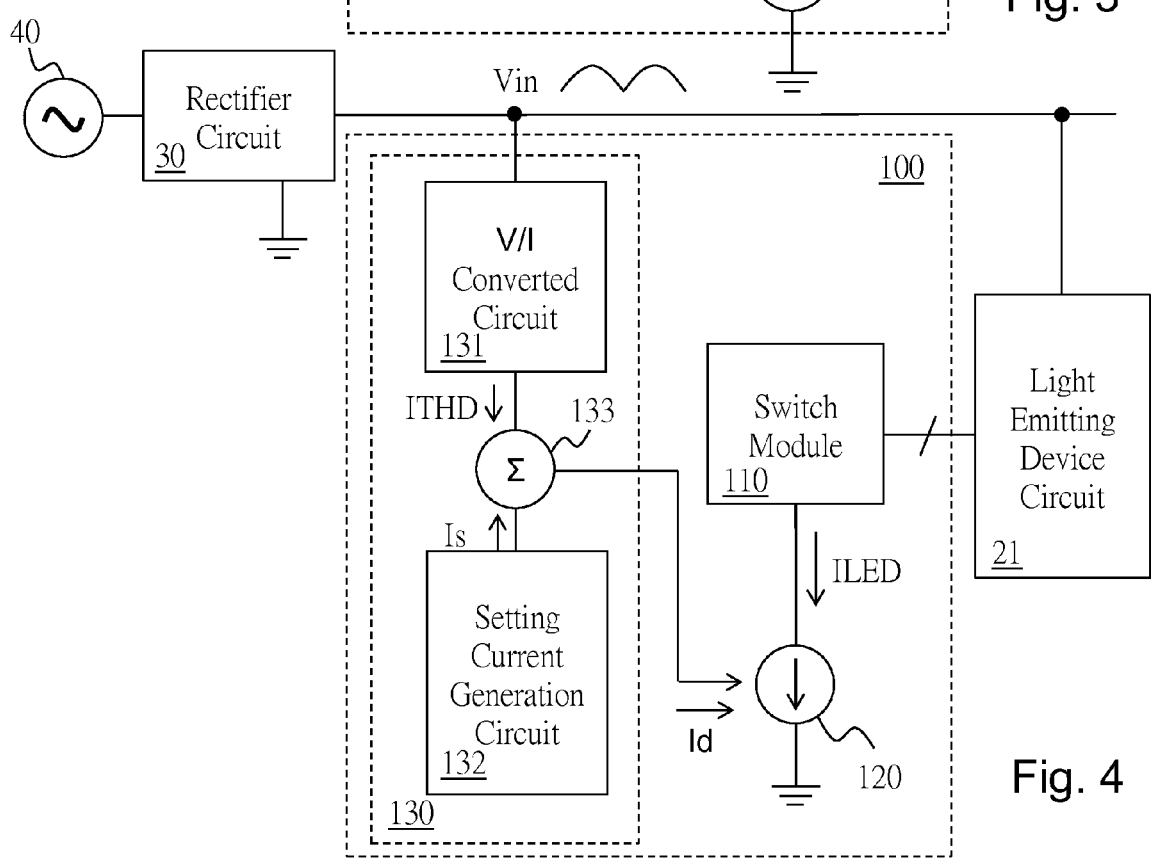
FIG. 4 shows a third embodiment of the present invention.

FIG. 4 shows a third embodiment of the present invention, which shows a second embodiment of the THD compensation circuit 130. This embodiment is different from the second embodiment in that, in this embodiment, the THD compensation circuit 130 further includes a setting current generation circuit 132 and an adder/subtractor circuit 133, besides the voltage-to-current conversion circuit 131. The setting current generation circuit 132 is for generating a setting current Is according to a reference signal (to be described in detail later). The adder/subtractor circuit 133 is coupled to the voltage-to-current conversion circuit 131 and the setting current generation circuit 132, for generating the adjustment current Id according to the THD compensation current ITHD and the setting current Is. The adder/subtractor circuit 133 adds its two inputs to generate a sum, or subtract one input from the other input to generate a difference (which can be regarded as adding a negative input to a positive input), depending on the required relationship between its inputs.

Figure 11A:
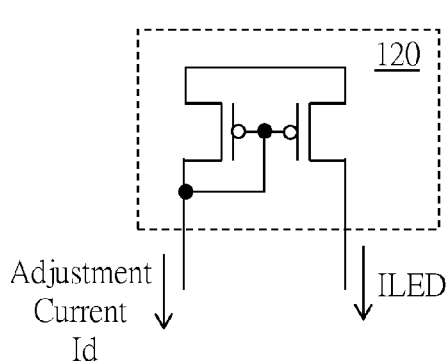
FIGS. 11A-11E show several embodiments of the current source circuit 120, to show how the current source circuit 120 provides the light emitting device current ILED according to an adjustment current Id.
Figure 11B:
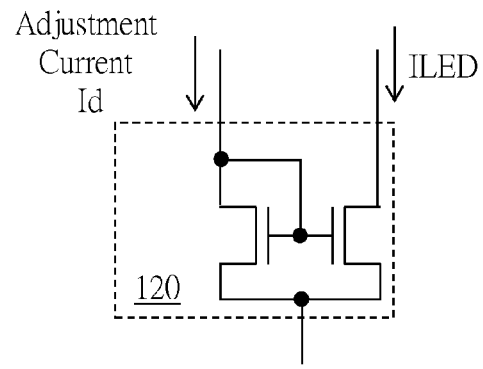
Figure 11C:
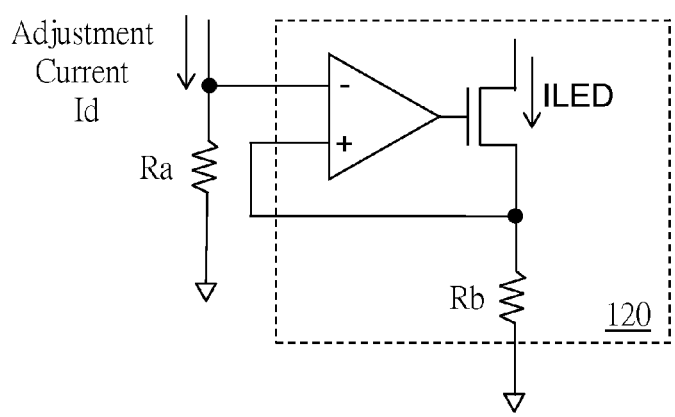
Figure 11D:
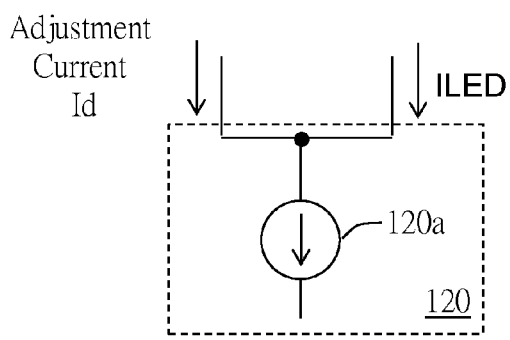
Figure 11E:
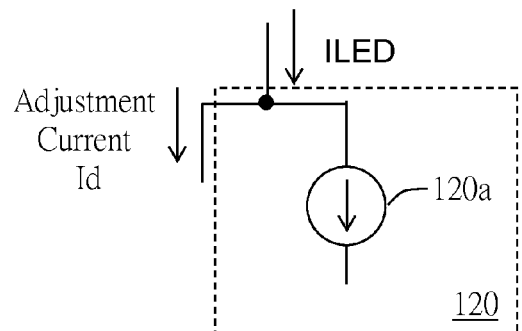

That the current source circuit 120 provides the light emitting device current ILED according the adjustment current Id can be embodied in various ways, and the present invention is not limited to any of them. For example, referring to FIGS. 11A-11B, the current source circuit 120 may be a current duplication circuit (there are various forms of the current duplication circuit, and the present invention is not limited to any of them), which duplicates the adjustment current Id to generate the light emitting device current ILED which is equal to or proportional to the adjustment current Id (when any of the switches S1-S4 turns ON) according to a duplication ratio of the current duplication circuit. FIG. 11C shows another embodiment of the current source circuit 120. In this embodiment, the adjustment current Id multiplied by the resistance of a resistor Ra is equal to the light emitting device current ILED multiplied by the resistance of a resistor Rb, and thus, the light emitting device current ILED can be set equal to or proportional to the adjustment current Id according to the settings of the resistances of the resistors Ra and Rb. FIGS. 11D-11E illustrate that the light emitting device current ILED can be equal to the adjustment current Id minus or plus a constant current. FIG. 11D shows the former, wherein the current source circuit 120 includes for example but not limited to a constant current source 120a, and the light emitting device current ILED is the adjustment current Id minus the constant current determined by the constant current source 120a. FIG. 11E shows the latter, wherein the current source circuit 120 includes for example but not limited to the constant current source 120a, and the light emitting device current ILED is the adjustment current Id plus the constant current determined by the constant current source 120a.

The current source circuit 120 can be embodied by any one of the embodiments of FIGS. 11A-11E alone, or by two or more of the embodiments of FIGS. 11A-11E in combination.

Figure 5A:
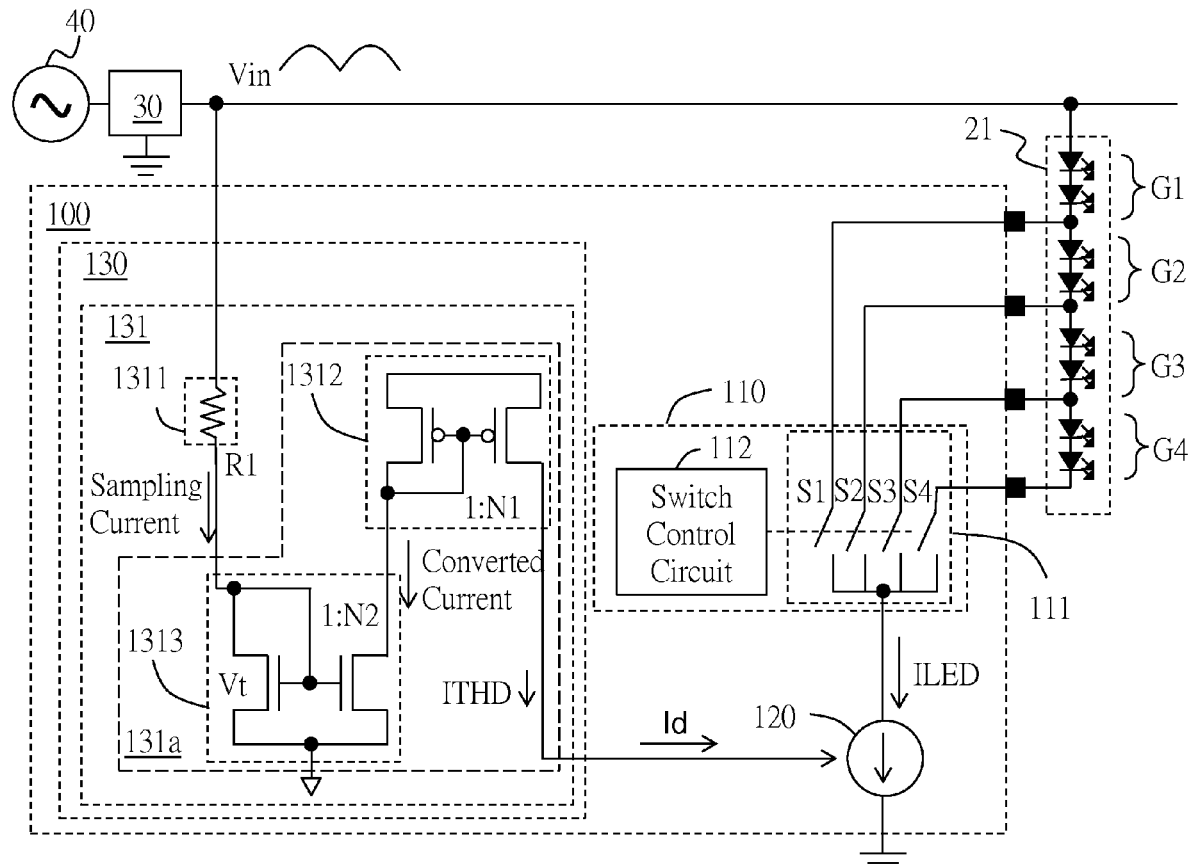
FIGS. 5A and 5B show a fourth embodiment of the present invention.
Figure 5B:
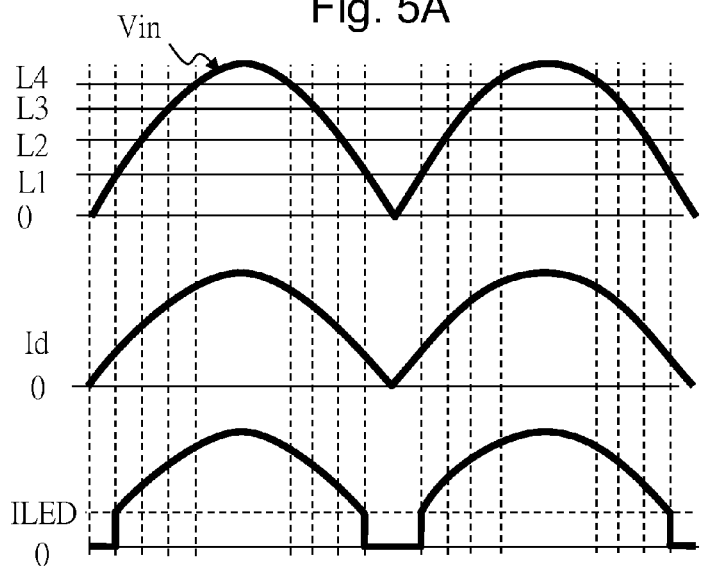

FIGS. 5A and 5B show a fourth embodiment of the present invention. This embodiment shows a more specific embodiment of the switch module 110, the current source circuit 120, and the THD compensation circuit 130 in the second embodiment. As shown in FIG. 5A, the switch module 110 includes a switch circuit 111 and a switch control circuit 112, which are the same as the switch circuit 11 and the switch control circuit 12 in FIG. 1A, respectively. The current source circuit 120 provides the light emitting device current ILED according to the adjustment current Id when at least one of the light emitting devices is conductive. The THD compensation circuit 130 includes a voltage-to-current conversion circuit 131, for receiving the rectified input voltage Vin, and converting the input voltage Vin to the THD compensation current ITHD; in this embodiment, the THD compensation current ITHD is used as the adjustment current Id. The voltage-to-current conversion circuit 131 includes an input voltage sense circuit 1311 and a current duplication circuit 131a. In one preferable embodiment, the current duplication circuit 131a includes current mirror circuits 1312 and 1313. The input voltage sense circuit 1311 receives the rectified input voltage Vin and provides an input voltage sampling signal. In one preferable embodiment, the input voltage sense circuit 1311 includes a resistance circuit, for example but not limited to a resistor R1 as shown in the figure, for receiving the rectified input voltage Vin, and generating a sampling current as the input voltage sampling signal. The current duplication circuit 131*a* generates the THD compensation current ITHD (which is used as the adjustment current Id in this embodiment) according to the sampling current, wherein the THD compensation current ITHD may be equal to or proportional to the sampling current. In the current duplication circuit 131*a*, the current mirror circuit 1313 is coupled between the current mirror circuit 1312 and the input voltage sense circuit 1311 (the resistor R1), for generating a converted current according to the sampling current, i.e., the input voltage sampling signal; and the current mirror circuit 1312 is coupled between the current mirror circuit 1313 and the current source circuit 120, for generating the THD compensation current ITHD according to the converted current. Note that, the aforementioned embodiment with two current mirror circuits is only an example, not for limiting the scope of the present invention; the number of the current mirror circuits may be more or less than this embodiment.

More specifically, referring to FIG. 5A, the current conversion ratios of the current mirror circuits 1312 and 1313 are for example 1:N1 (1 to N1) and 1:N2 (1 to N2) respectively; the resistance of the resistor R1 is R1; and the voltage drop across a transistor at the current sampling side is Vt. Thus, the adjustment current Id is:

$$Id = N1 \times N2 \times \frac{Vin - Vt}{R1}$$

Because the adjustment current Id is related to the input voltage Vin (the voltage drop Vt of the transistor is ignorable), the adjustment current Id has a similar phase angle as the rectified input voltage Vin. Therefore, as the current source circuit 120 generates the light emitting device current ILED according to the adjustment current Id, the THD can be reduced. FIG. 5B shows that this embodiment directly duplicates the adjustment current Id by a ratio 1:1 (1 to 1) as the light emitting device current ILED. However, referring to FIGS. 11A-11E as explained in the above, the light emitting device current ILED can be proportional to the adjustment current Id by any ratio, or can be the adjustment current Id plus or minus a constant current, or can be a ratio of the adjustment current Id plus or minus a constant current.

Figure 6A:
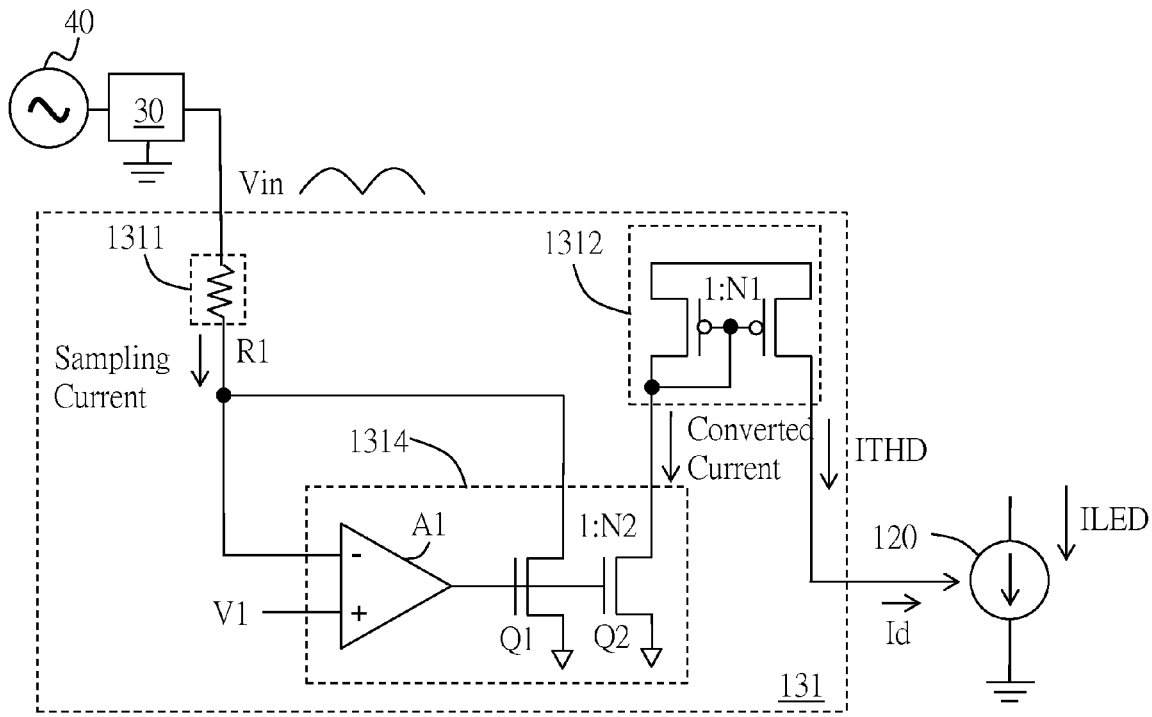
FIGS. 6A and 6B show a fifth embodiment of the present invention.
Figure 6B:
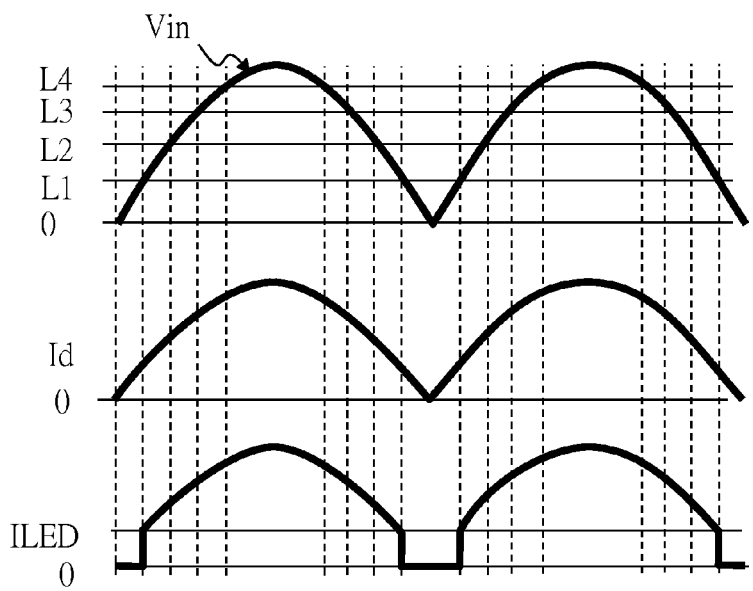

FIGS. 6A and 6B show a fifth embodiment of the present invention. This embodiment shows another more specific embodiment of the voltage-to-current conversion circuit 131 in the second embodiment. As shown in FIG. 6A, the voltage-to-current conversion circuit 131 includes the input voltage sense circuit 1311, the current mirror circuit 1312, and an amplifier circuit 1314. The input voltage sense circuit 1311 receives the rectified input voltage Vin and provides an input voltage sampling signal. In one preferable embodiment, the input voltage sense circuit 1311 includes a resistance circuit, for example but not limited to a resistor R1 as shown in the figure, for receiving the rectified input voltage Vin, and generating a sampling current as the input voltage sampling signal. The amplifier circuit 1314 is coupled between the current mirror circuit 1312 and the input voltage sense circuit 1311 (i.e., the resistor R1), and it includes an error amplifier A1 and transistors Q1 and Q2, for receiving the sampling current, and generating the converted current according to a reference signal V1. By the effect of the feedback loop in the amplifier circuit 1314, the voltages at the two input terminals of the error amplifier A1 are equal to each other at stable state. The current mirror circuit 132 is coupled between the amplifier circuit 1314 and the current source circuit 120, for generating the THD compensation current ITHD, which is used as the adjustment current Id in this embodiment, according to the converted current.

Still referring FIG. 6A, the current conversion ratios of the current mirror circuit 1312 and the amplifier circuit 1314 are 1:N1 (1 to N1) and 1:N2 (1 to N2) respectively, $$Id = N1 \times N2 \times \frac{Vin - V1}{R1}$$

and one input terminal of the amplifier circuit 1314 receives the reference signal V1, so the adjustment current Id is: Because the adjustment current Id is related to the input voltage Vin, the adjustment current Id has a similar phase angle as the rectified input voltage Vin. Therefore, as the current source circuit 120 generates the light emitting device current ILED according to the adjustment current Id, the THD can be reduced. FIG. 6B shows that this embodiment directly duplicates the adjustment current Id by a ratio 1:1 (1 to 1) as the light emitting device current ILED. However, referring to FIGS. 11A-11E as explained in the above, the light emitting device current ILED can be proportional to the adjustment current Id by any ratio, or can be the adjustment current Id plus or minus a constant current, or can be a ratio of the adjustment current Id plus or minus a constant current.

Figure 7A:
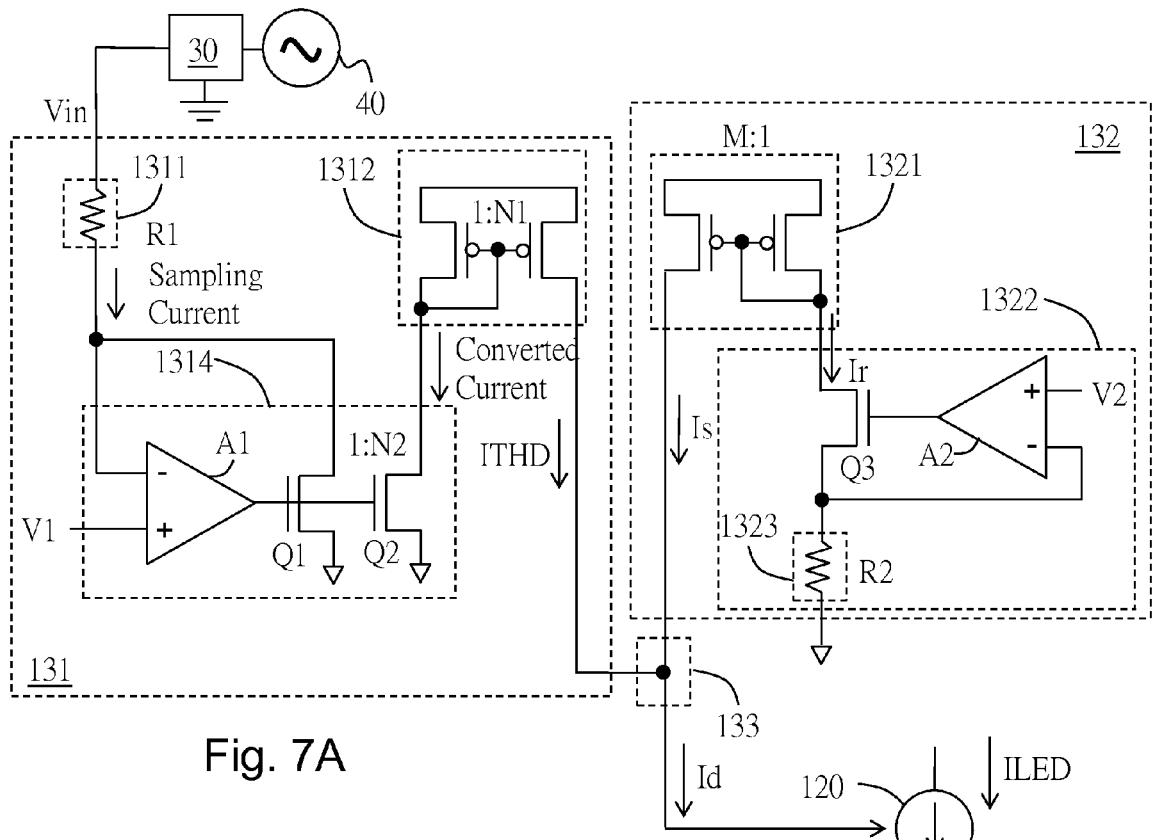
FIGS. 7A and 7B show a sixth embodiment of the present invention.
Figure 7B:
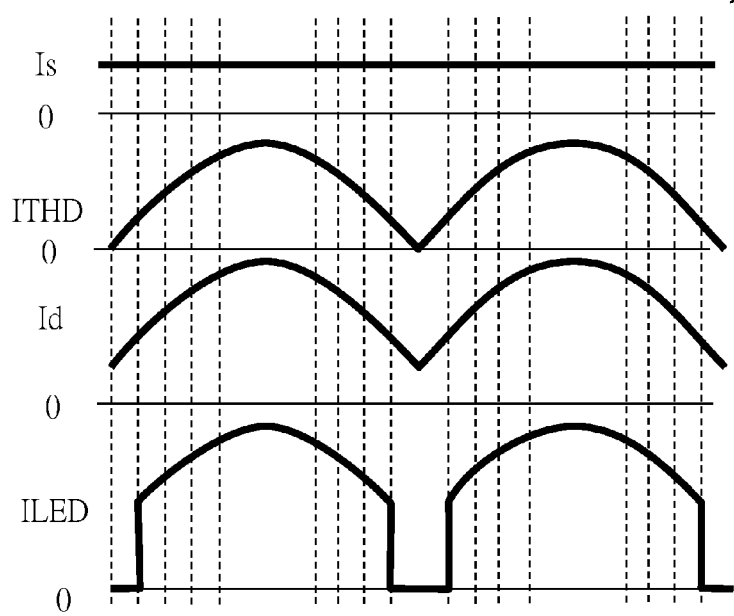

FIGS. 7A and 7B show a sixth embodiment of the present invention. This embodiment shows a more specific embodiment of the voltage-to-current conversion circuit 131, the setting current generation circuit 132, and the adder/subtractor circuit 133 in the third embodiment. As shown in FIG. 7A, the voltage-to-current conversion circuit 131 is for example the same as the one shown in the fifth embodiment, which includes the input voltage sense circuit 1311, the current mirror circuit 1312, and an amplifier circuit 1314. The setting current generation circuit 132 provides a setting current Is to the adder/subtractor circuit 133. The adder/subtractor circuit 133 is coupled to the voltage-to-current conversion circuit 131 and the setting current generation circuit 132, for generating the adjustment current Id according to the THD compensation current ITHD and the setting current Is. The current source circuit 120 provides the light emitting device current ILED according to the adjustment current Id. The adder/subtractor circuit 133 includes for example but not limited to a node as shown in the figure, which combines the THD compensation current ITHD and the setting current Is to generate the adjustment current Id, in this case the adjustment current Id is a sum of the THD compensation current ITHD and the setting current Is. As shown in the figure, the setting current generation circuit 132 includes for example but not limited to a current mirror circuit 1321 and an amplifier circuit 1322. The current mirror circuit 1321 is coupled to the adder/subtractor circuit 133, for generating the setting current Is according to a reference current Ir. The amplifier circuit 1322 includes an error amplifier A2, a transistor Q3, and a resistance circuit 1323, wherein the resistance circuit is for example but not limited to a resistor R2. The amplifier circuit 1322 is coupled to the current mirror circuit 1321, for generating the reference current Ir according to a reference signal V2. By the effect of the feedback loop in the amplifier circuit 1322, the voltages at the two input terminals of the error amplifier A2 are equal to each other at stable state.

Referring to FIGS. 7A and 7B, for example, the current conversion ratio of the current mirror circuits 1321 is M:1 (M to 1); the resistance of the resistor R2 is R2; the voltage-to-current conversion circuit 131 is the one as shown in the fifth embodiment. Thus, the light emitting device current ILED is:

$$ILED = Id = Is + ITHD = M \times \frac{V2}{R2} + N1 \times N2 \times \frac{Vin - V1}{R1}$$

The waveforms of the signals Is, ITHD, Id and ILED are shown in FIG. 7B. In this embodiment, the adjustment current Id is a sum of the THD compensation current ITHD and the setting current Is. However, the present invention is not limited to this arrangement; the adjustment current Id may be a difference between the THD compensation current ITHD and the setting current Is. In other words, the adder/subtractor circuit 133 can be an adder circuit, or a subtractor circuit. Besides, FIG. 7B shows that the light emitting device current ILED can be the adjustment current Id plus a constant current.

Figure 8A:
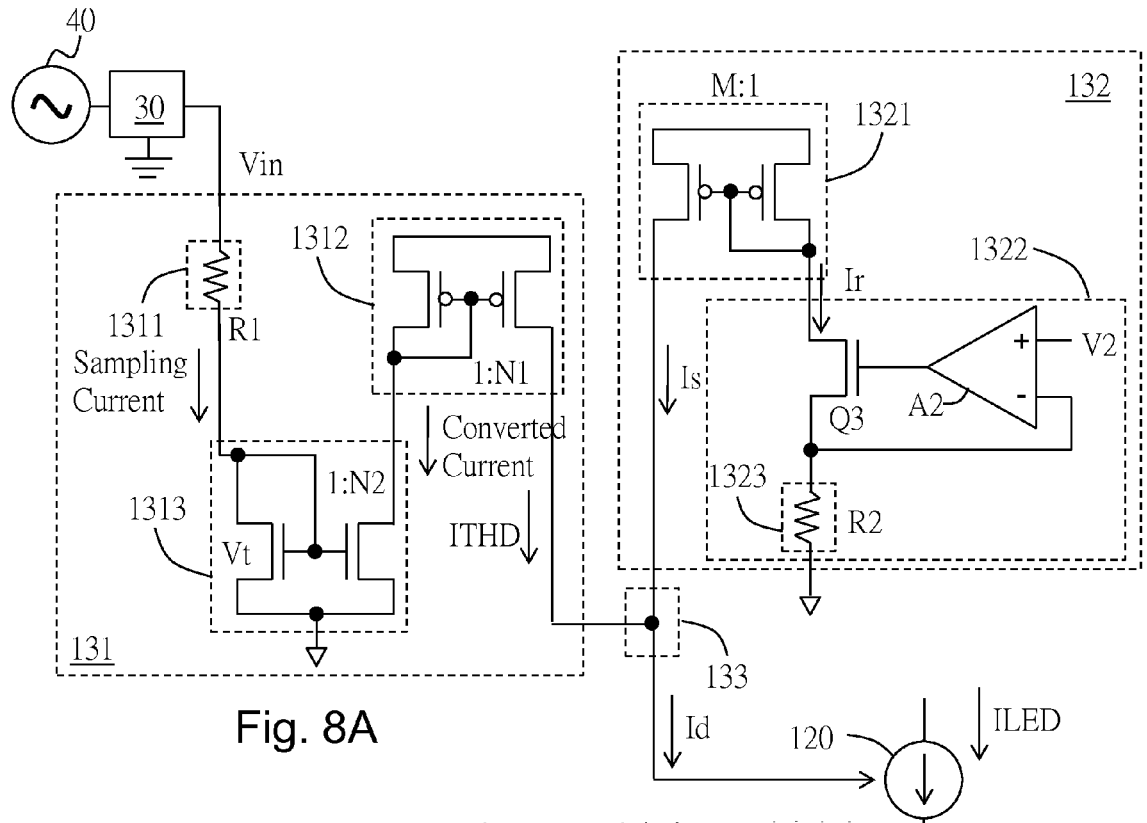
FIGS. 8A and 8B show a seventh embodiment of the present invention.
Figure 8B:
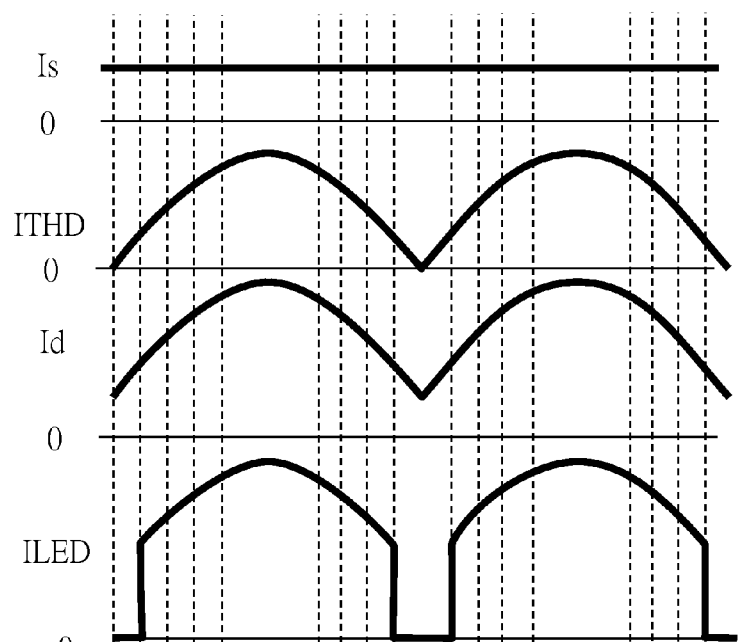

FIGS. 8A and 8B show a seventh embodiment of the present invention. This embodiment shows a more specific embodiment of the voltage-to-current conversion circuit 131, the setting current generation circuit 132, and the adder/subtractor circuit 133 in the third embodiment. As shown in FIG. 8A, the voltage-to-current conversion circuit 131 is for example the same as the one shown in the fourth embodiment, which includes the input voltage sense circuit 1311, the current mirror circuit 1312, and the current mirror circuit 1313. The setting current generation circuit 132 is for example the same as the setting current generation circuit 132 shown in FIG. 7A, and it provides a setting current Is to the adder/subtractor circuit 133. The adder/subtractor circuit 133 is coupled to the voltage-to-current conversion circuit 131 and the setting current generation circuit 132, for generating the adjustment current Id according to the THD compensation current ITHD and the setting current Is. The current source circuit 120 provides the light emitting device current ILED according to the adjustment current Id. The adder/subtractor circuit 133 includes for example but not limited to a node as shown in the figure, which combines the THD compensation current ITHD and the setting current Is to generate the adjustment current Id, which is a sum of the THD compensation current ITHD and the setting current Is in this embodiment.

Referring to FIGS. 8A and 8B, for example, the current conversion ratio of the current mirror circuits 1321 is M:1 (M to 1); the resistance of the resistor R2 is R2; and the voltage-to-current conversion circuit 131 is the one as shown in the fifth embodiment. Thus, the light emitting device current ILED is:

$$ILED = Id = Is + ITHD = M \times \frac{V2}{R2} + N1 \times N2 \times \frac{Vin - Vt}{R1}$$

The waveforms of the signals Is, ITHD, Id and ILED are shown in FIG. 8B. In this embodiment, the adjustment current Id is a sum of the THD compensation current ITHD and the setting current Is. However, the present invention is not limited to this arrangement; the adjustment current Id may be a difference between the THD compensation current ITHD and the setting current Is. In other words, the adder/subtractor circuit 133 can be an adder circuit, or a subtractor circuit. Besides, FIG. 8B shows that the light emitting device current ILED can be the adjustment current Id plus a constant current.

Figure 9A:
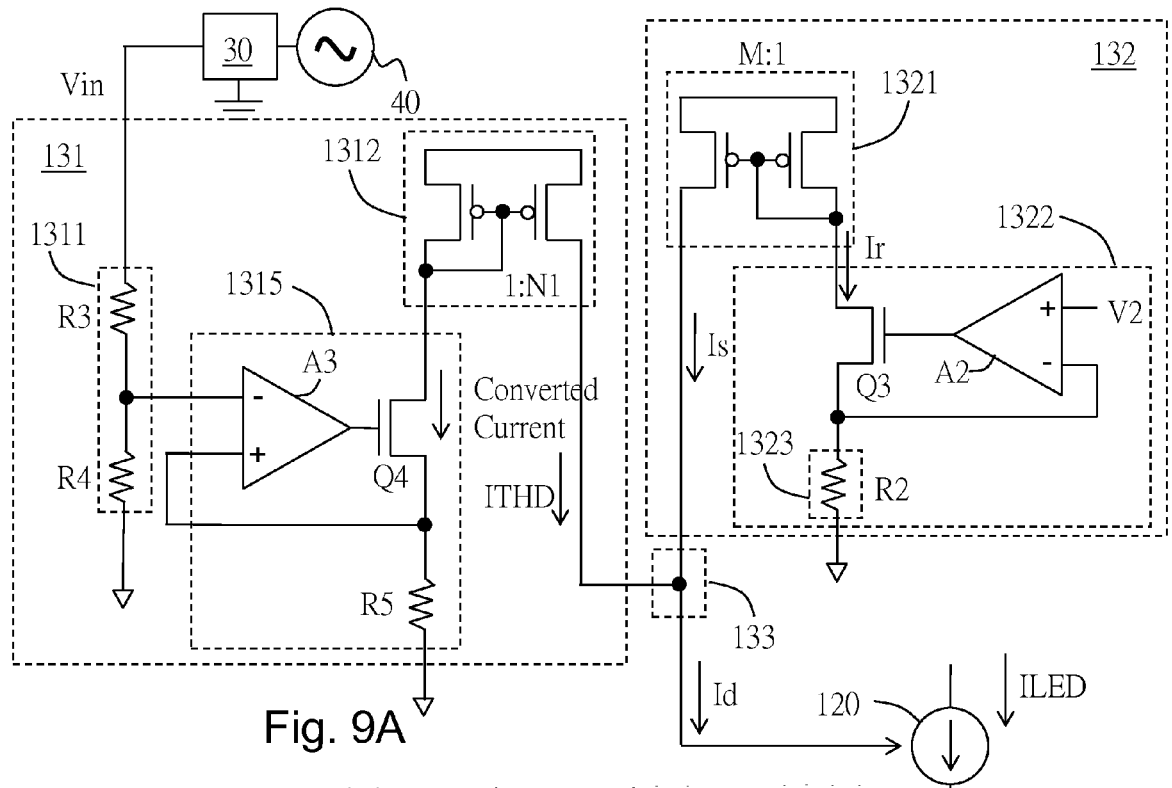
FIGS. 9A and 9B show an eighth embodiment of the present invention.
Figure 9B:
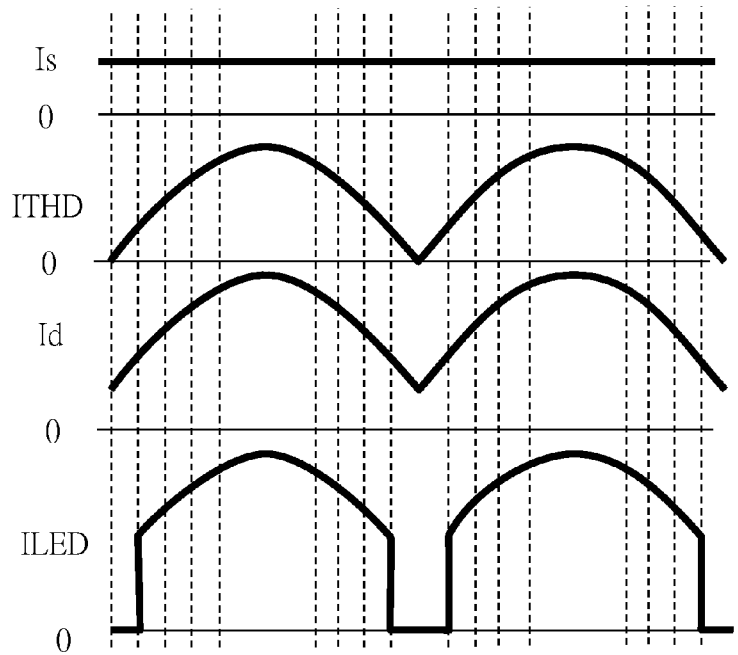

FIGS. 9A and 9B show an eighth embodiment of the present invention. This embodiment shows another more specific embodiment of the voltage-to-current conversion circuit 131, the setting current generation circuit 132, and the adder/subtractor circuit 133 in the third embodiment. As shown in FIG. 9A, the voltage-to-current conversion circuit 131 includes the input voltage sense circuit 1311, the current mirror circuit 1312, and an amplifier circuit 1315. The setting current generation circuit 132 is for example the same as the setting current generation circuit 132 shown in FIG. 7A, and it provides a setting current Is to the adder/subtractor circuit 133. The adder/subtractor circuit 133 is coupled to the voltage-to-current conversion circuit 131 and the setting current generation circuit 132, for generating the adjustment current Id according to the THD compensation current ITHD and the setting current Is. The current source circuit 120 provides the light emitting device current ILED according to the adjustment current Id. The adder/subtractor circuit 133 includes for example but not limited to a node as shown in the figure, which combines the THD compensation current ITHD and the setting current Is to generate the adjustment current Id, which is a sum of the THD compensation current ITHD and the setting current Is. As shown in the figure, the voltage-to-current conversion circuit 131 includes the input voltage sense circuit 1311, the mirror circuit 1312, and the amplifier circuit 1315. The input voltage sense circuit 1311 includes a voltage divider circuit, which for example includes resistors R3 and R4 connected in series, for receiving the rectified input voltage Vin, and generating a divided voltage as the input voltage sampling signal, which is K times the rectified input voltage Vin, wherein:

$$K = \frac{R4}{R3 + R4}$$

The amplifier circuit 1315 is coupled between the current mirror circuit 1312 and the input voltage sense circuit 1311 (i.e., the voltage divider circuit), and it includes an error amplifier A3, a transistor Q4, and a resistor R5, for generating the converted current according to the divided voltage which is K times the rectified input voltage Vin. By the effect of the feedback loop in the amplifier circuit 1315, the voltages at the two input terminals of the error amplifier A3 are equal to each other at stable state. The current mirror circuit 1312 is coupled between the amplifier circuit 1315 and the adder/subtractor circuit 133, for generating the THD compensation current ITHD according to the converted current.

Referring to FIG. 9A, for example, the current conversion ratio of the current mirror circuits 1312 is 1:N1 (1 to N1), and the resistor R5 is connected to the transistor R4 in series, so the adjustment current Id is:

$$Id = Is + ITHD = M \times \frac{V2}{R2} + N1 \times K \times \frac{Vin}{R5}$$

The waveforms of the signals Is, ITHD, Id and ILED are shown in FIG. 9B. In this embodiment, the adjustment current Id is a sum of the THD compensation current ITHD and the setting current Is. However, the present invention is not limited to this arrangement; the adjustment current Id may be a difference between the THD compensation current ITHD and the setting current Is. In other words the adder/subtractor circuit 133 can be an adder circuit, or a subtractor circuit. Besides, FIG. 9B shows that the light emitting device current ILED can be the adjustment current Id plus a constant current.

Figure 10A:
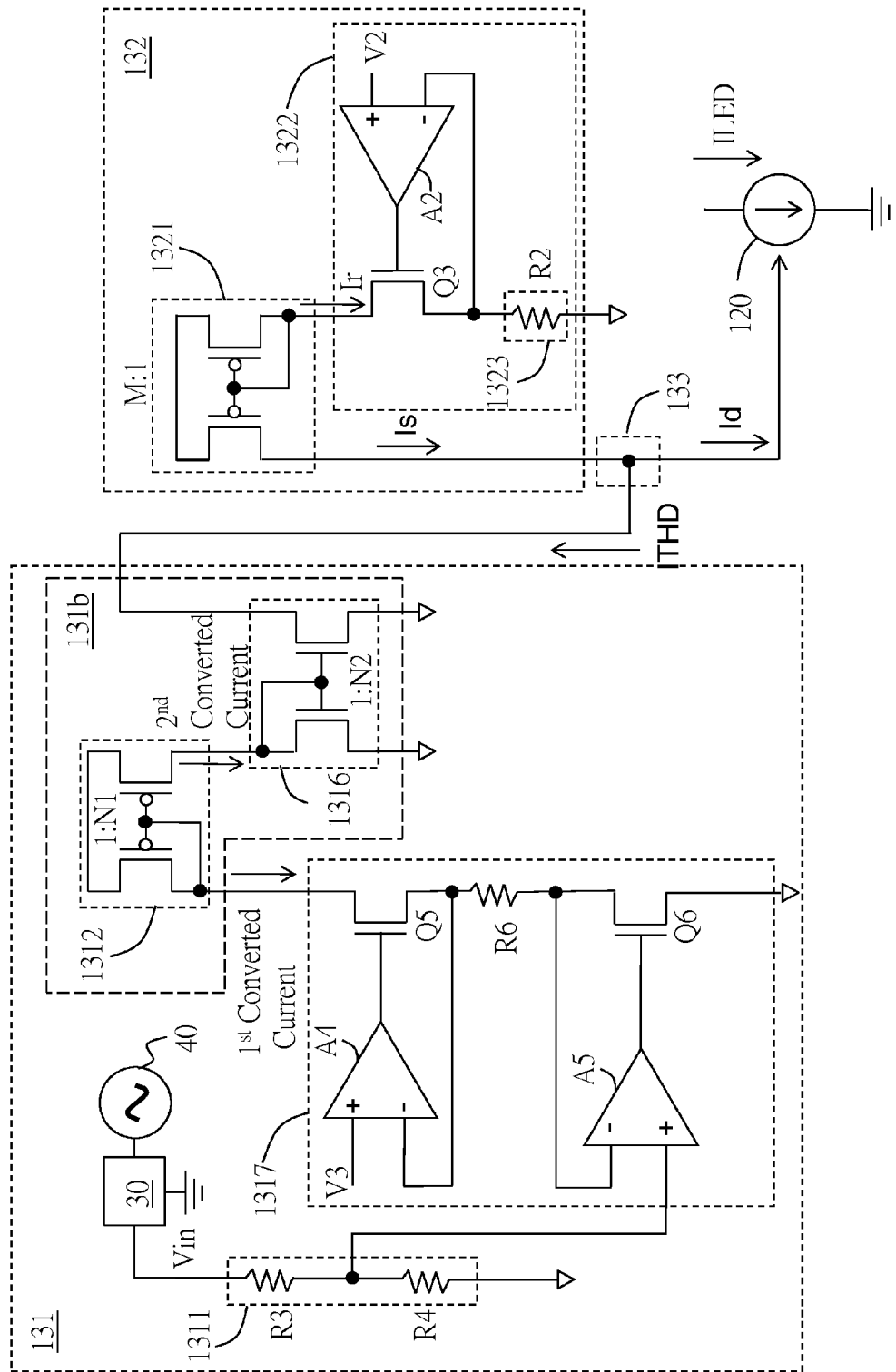
FIGS. 10A-10C show a ninth embodiment of the present invention.
Figure 10B:
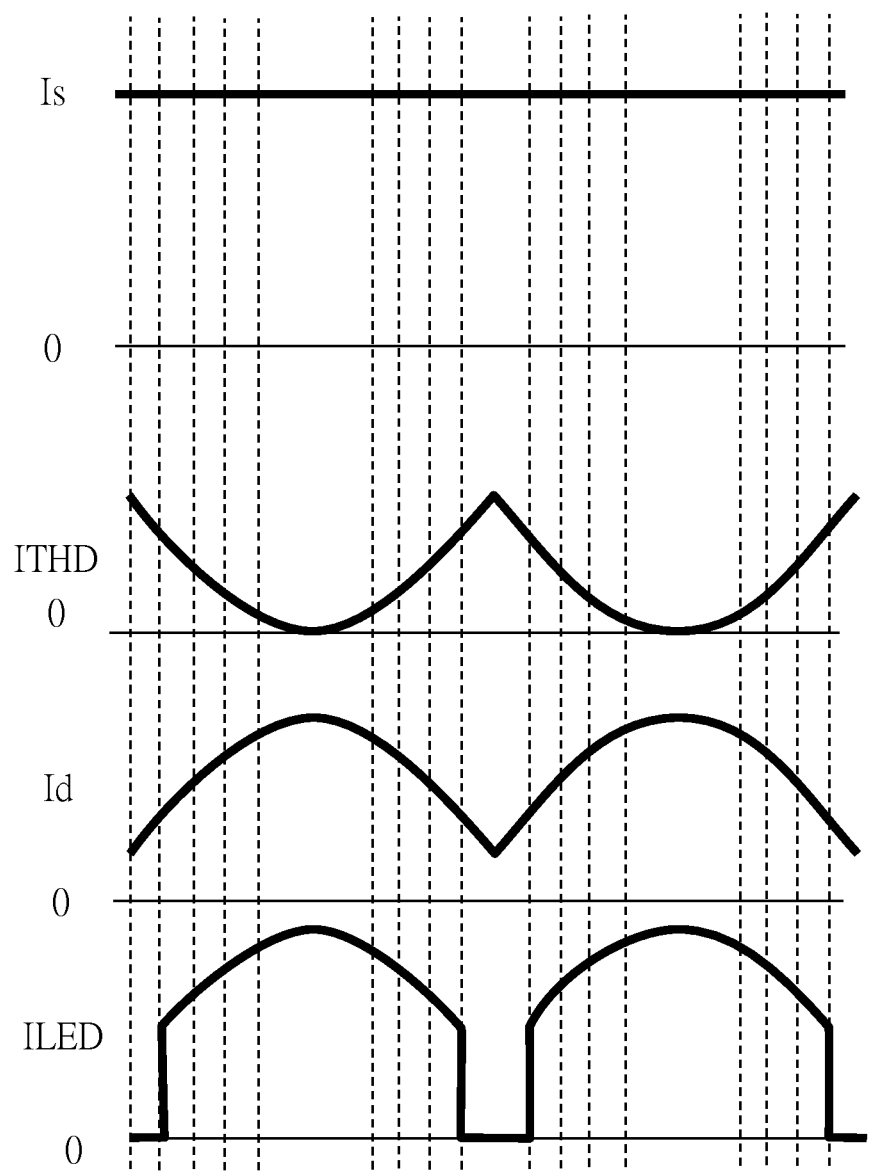
Figure 10C:
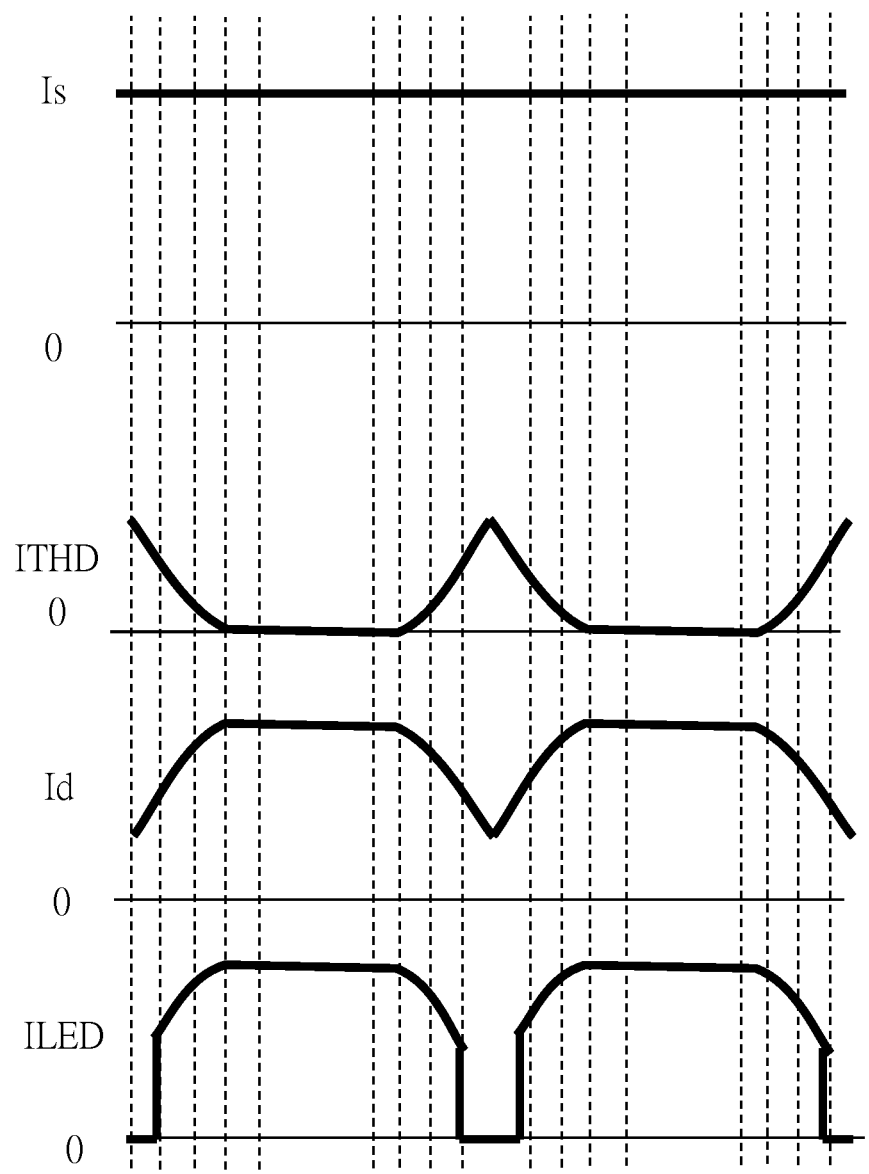

FIGS. 10A-10C show a ninth embodiment of the present invention. This embodiment shows another more specific embodiment of the voltage-to-current conversion circuit 131, the setting current generation circuit 132, and the adder/subtractor circuit 133 in the third embodiment. As shown in FIG. 10A, the setting current generation circuit 132 and the adder/subtractor circuit 133 are for example the same as the ones shown in the sixth embodiment. The voltage-to-current conversion circuit 131 includes the input voltage sense circuit 1311, a current duplication circuit 131b (which includes the current mirror circuit 1312 and a current mirror circuit 1316 in this embodiment), and an amplifier circuit 1317. The input voltage sense circuit 1311 includes the voltage divider circuit, which for example includes the resistors R3 and R4 connected in series, for receiving the rectified input voltage Vin, and generating a divided voltage as the input voltage sampling signal, which is K times the rectified input voltage Vin, wherein:

$$K = \frac{R4}{R3 + R4}$$

The amplifier circuit 1317 is coupled between the input voltage sense circuit 1311 (i.e., the voltage divider circuit) and the current duplication circuit 131b, and it includes error amplifiers A4 and A5, transistors Q5 and Q6, and a resistor R6. The amplifier circuit 1317 generates a first converted current according to the divided voltage of K times the rectified input voltage Vin and a reference signal V3. By the effect of the feedback loop in the amplifier circuit 1317, the voltages at the two input terminals of the error amplifier A4 are equal to each other at stable state, and the voltages at the two input terminals of the error amplifier A5 are equal to each other at stable state. The voltage drop across the resistor R6 is equal to a difference of the reference signal V3 and the divided voltage of K times the rectified input voltage Vin, and the first converted current is equal to the voltage drop across the resistor R6 divided by a resistance of the resistor R6. The current mirror circuit 1316 is coupled between the amplifier circuit 1317 and the current mirror circuit 1312, for generating a second converted current according to the first converted current. The current mirror circuit 1312 is coupled to the adder/subtractor circuit 133, for providing the THD compensation current ITHD according to the second converted current.

More specifically, referring to FIG. 10A, for example, the current conversion ratio of the current mirror circuits 1316 is 1:N1 (1 to N1); the current conversion ratio of the current mirror circuits 1312 is 1:N2 (1 to N2); and the resistance of the resistor R6 is R6. Thus, the adjustment current Id is:

$$Id = Is - ITHD = M \times \frac{V2}{R2} - N1 \times N2 \times \frac{V3 - K \times Vin}{R6}$$

The waveforms of the signals Is, ITHD, Id and ILED are shown in FIG. 10B. In this embodiment, the adjustment current Id is a difference of the THD compensation current ITHD and the setting current Is, and the THD compensation current ITHD has a waveform which has a phase angle substantially same as the rectified input voltage Vin, but an amplitude direction substantially opposite to the rectified input voltage Vin (which can be regarded as having an opposite sign). In the aforementioned embodiments, the THD compensation current ITHD has a waveform which has a phase angle substantially same as the rectified input voltage Vin, and a amplitude direction substantially same as the rectified input voltage Vin (which can be regarded as having a same sign). In this embodiment, the adder/subtractor circuit 133 is a subtrator circuit. Besides, when K times Vin (K*Vin) is higher than the reference signal V3, there is no current flowing through the resistor R6 and the first converted current is zero current, so depending on the settings of the reference signal V3 and K, the same circuit can generate the signal waveforms as shown in FIG. 10C.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, a device or circuit which does not substantially influence the primary function of a signal can be inserted between any two devices or circuits in the shown embodiments, such as a switch or the like, so the term "couple" should include direct and indirect connections. For another example, the light emitting device that is applicable to the present invention is not limited to the LED as shown and described in the embodiments above, but may be any light emitting device with a forward terminal and a reverse terminal. For another example, the number of the current mirrors in the aforementioned embodiments may be changed according to practical requirement. For another example, a PMOS device in the embodiments can be changed to an NMOS device and an NMOS device in the embodiments can be changed to a PMOS device, with corresponding amendments to the circuit and the signals. For another example, each LED group does not necessarily have to contain the same number of LEDs (such as two LEDs), that is, the numbers of the LEDs may be different between different groups. In view of the foregoing, the spirit of the present invention should cover all such and other modifications and variations, which should be interpreted to fall within the scope of the following claims and their equivalents.

What is claimed is:

1. A light emitting device driver circuit configured to operably drive a light emitting device circuit which is operative according to a rectified input voltage, the light emitting device circuit including a plurality of light emitting devices connected in series, the plural light emitting devices being divided into a plurality of groups, wherein each group includes at least one light emitting device, the light emitting device driver circuit comprising:

a switch module, which includes a plurality of switches, wherein each switch is coupled to a corresponding one of the groups, the switch module being configured to operably determine which of the light emitting devices are turned ON according to the rectified input voltage;

a current source circuit, which is coupled to the switch module, and configured to operably provide a light emitting device current according to an adjustment current when at least one of the light emitting devices is turned ON, wherein the light emitting device current is not a constant, and the light emitting device current has substantially the same phase angle as the rectified input voltage for at least a part of time in a cycle period of the rectified input voltage; and a total harmonic distortion (THD) compensation circuit, which is coupled to the current source circuit, and configured to operably generate the adjustment current according to the rectified input voltage;

wherein the THD compensation circuit includes:

a voltage-to-current conversion circuit, configured to operably convert the rectified input voltage to a THD compensation current;

a setting current generation circuit, configured to operably generate a setting current according to a reference signal; and an adder/subtractor circuit, which is coupled to the voltage-to-current conversion circuit and the setting current generation circuit, and configured to operably generate the adjustment current according to the THD compensation current and the setting current.

2. The light emitting device driver circuit of claim 1, wherein the voltage-to-current conversion circuit includes:

an input voltage sense circuit, configured to operably receive the rectified input voltage and generate an input voltage sampling signal; and a current duplication circuit, which is coupled to the input voltage sense circuit, and configured to operably generate the THD compensation current according to the input voltage sampling signal.

3. The light emitting device driver circuit of claim 1, wherein the voltage-to-current conversion circuit includes:

an input voltage sense circuit, configured to operably receive the rectified input voltage and generate an input voltage sampling signal;

an amplifier circuit, which is coupled to the input voltage sense circuit, and configured to operably generate a converted current according to the input voltage sampling signal and a reference signal; and a current mirror circuit, which is coupled to the amplifier circuit, and configured to operably generate the THD compensation current according to the converted current.

4. The light emitting device driver circuit of claim 1, wherein the voltage-to-current conversion circuit includes:

an input voltage sense circuit which includes a voltage divider circuit, configured to operably generate a divided voltage of the rectified input voltage as an input voltage sampling signal;

an amplifier circuit, which is coupled to the input voltage sense circuit, and configured to operably generate a converted current according to the input voltage sampling signal; and a current mirror circuit, which is coupled to the amplifier circuit, and configured to operably generate the THD compensation current according to the converted current.

5. The light emitting device driver circuit of claim 1, wherein the setting current generation circuit includes:

an amplifier circuit, configured to operably generate a reference current according to the reference signal; and a current mirror circuit, which is coupled to the amplifier circuit, and configured to operably generate the setting current according to the reference current.

6. A light emitting device driver circuit configured to operably drive a light emitting device circuit which is operative according to a rectified input voltage, the light emitting device circuit including a plurality of light emitting devices connected in series, the plural light emitting devices being divided into a plurality of groups, wherein each group includes at least one light emitting device, the light emitting device driver circuit comprising:

a switch module, which includes a plurality of switches, wherein each switch is coupled to a corresponding one of the groups, the switch module being configured to operably determine which of the light emitting devices are turned ON according to the rectified input voltage;

a current source circuit, which is coupled to the switch module, and configured to operably provide a light emitting device current according to an adjustment current when at least one of the light emitting devices is turned ON, wherein the light emitting device current is not a constant, and the light emitting device current has substantially the same phase angle as the rectified input voltage for at least a part of time in a cycle period of the rectified input voltage; and a total harmonic distortion (THD) compensation circuit, which is coupled to the current source circuit, and configured to operably generate the adjustment current according to the rectified input voltage;

wherein the THD compensation circuit includes:

a voltage-to-current conversion circuit, configured to operably convert the rectified input voltage to a THD compensation current;

an input voltage sense circuit, configured to operably receive the rectified input voltage and generate an input voltage sampling signal; and a current duplication circuit, which is coupled to the input voltage sense circuit, and configured to operably generate the THD compensation current according to the input voltage sampling signal.

7. A light emitting device driver circuit configured to operably drive a light emitting device circuit which is operative according to a rectified input voltage, the light emitting device circuit including a plurality of light emitting devices connected in series, the plural light emitting devices being divided into a plurality of groups, wherein each group includes at least one light emitting device, the light emitting device driver circuit comprising:

a switch module, which includes a plurality of switches, wherein each switch is coupled to a corresponding one of the groups, the switch module being configured to operably determine which of the light emitting devices are turned ON according to the rectified input voltage;

a current source circuit, which is coupled to the switch module, and configured to operably provide a light emitting device current according to an adjustment current when at least one of the light emitting devices is turned ON, wherein the light emitting device current is not a constant, and the light emitting device current has substantially the same phase angle as the rectified input voltage for at least a part of time in a cycle period of the rectified input voltage; and a total harmonic distortion (THD) compensation circuit, which is coupled to the current source circuit, and configured to operably generate the adjustment current according to the rectified input voltage;

wherein the THD compensation circuit includes:

a voltage-to-current conversion circuit, configured to operably convert the rectified input voltage to a THD compensation current;

an input voltage sense circuit, configured to operably receive the rectified input voltage and generated an input voltage sampling signal;

an amplifier circuit, which is coupled to the input voltage sense circuit, and configured to operably generate a converted current according to the input voltage sampling signal and a reference signal; and a current mirror circuit, which is coupled to the amplifier circuit, and configured to operably generate the THD compensation current according to the converted current.

8. A light emitting device driver circuit configured to operably drive a light emitting device circuit which is operative according to a rectified input voltage, the light emitting device circuit including a plurality of light emitting devices connected in series, the plural light emitting devices being divided into a plurality of groups, wherein each group includes at least one light emitting device, the light emitting device driver circuit comprising:

a switch module, which includes a plurality of switches, wherein each switch is coupled to a corresponding one of the groups, the switch module being configured to operably determine which of the light emitting devices are turned ON according to the rectified input voltage;

a current source circuit, which is coupled to the switch module, and configured to operably provide a light emitting device current according to an adjustment current when at least one of the light emitting devices is turned ON, wherein the light emitting device current is not a constant, and the light emitting device current has substantially the same phase angle as the rectified input voltage for at least a part of time in a cycle period of the rectified input voltage; and a total harmonic distortion (THD) compensation circuit, which is coupled to the current source circuit, and configured to operably generate the adjustment current according to the rectified input voltage;

wherein the THD compensation circuit includes:

a voltage-to-current conversion circuit, configured to operably convert the rectified input voltage to a THD compensation current;

an input voltage sense circuit which includes a voltage divider circuit, configured to operably generate a divided voltage of the rectified input voltage as an input voltage sampling signal;

an amplifier circuit, which is coupled to the input voltage sense circuit, and configured to operably generate a converted current according to the input voltage sampling signal; and a current mirror circuit, which is coupled to the amplifier circuit, and configured to operably generate the THD compensation current according to the converted current.

9. A method for driving a light emitting device circuit, wherein the light emitting device circuit includes a plurality of light emitting devices connected in series, the plural light emitting devices being divided into a plurality of groups, wherein each group includes at least one light emitting device, the method comprising:

providing a rectified input voltage;

determining which of the light emitting devices are turned ON according to the rectified input voltage;

generating an adjustment current according to the rectified input voltage, wherein the adjustment current has a substantially same phase angle as the rectified input voltage; and providing a light emitting device current to the turned-ON light emitting device(s) according to an adjustment current, wherein the light emitting device current is not a constant, and the light emitting device current has substantially the same phase angle as the rectified input voltage for at least a part of time in a cycle period of the rectified input voltage;

wherein the step of generating the adjustment current according to the rectified input voltage includes:

converting the rectified input voltage to a total harmonic distortion (THD) compensation current;

generating a setting current according to a reference signal; and generating the adjustment current according to the THD compensation current and the setting current.

10. The method of claim 9, wherein the step of generating the adjustment current according to the THD compensation current and the setting current includes: adding the THD compensation current with the setting current to generate a sum as the adjustment current, or subtracting one of the THD compensation current and the setting current from the other to generate a difference as the adjustment current.

11. The method of claim 9, wherein the THD compensation current has a waveform which has a substantially same phase angle as the rectified input voltage, and an amplitude direction which is the same as the rectified input voltage.

12. The method of claim 9, wherein the THD compensation current has a waveform which has a substantially same phase angle as the rectified input voltage, and an amplitude direction opposite to the rectified input voltage.

* * * * *